(12) United States Patent
Kim et al.

(10) Patent No.: US 9,198,292 B2
(45) Date of Patent: Nov. 24, 2015

(54) BATTERY PACK INCLUDING CIRCUIT BOARD ASSEMBLY HAVING FIRST CIRCUIT BOARD CONNECTED TO TERMINALS AND SECOND CIRCUIT BOARD CONNECTED TO FIRST CIRCUIT BOARD

(75) Inventors: Hyun-Joong Kim, Yongin-si (KR); Kyoung-Hwan Noh, Yongin-si (KR); Jun-Ho Lee, Yongin-si (KR); Hyun-Kook Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 282 days.

(21) Appl. No.: 13/609,124

(22) Filed: Sep. 10, 2012

(65) Prior Publication Data

US 2013/0302651 A1 Nov. 14, 2013

Related U.S. Application Data

(60) Provisional application No. 61/644,073, filed on May 8, 2012.

(51) Int. Cl.
| | |
|---|---|
| *H01M 2/20* | (2006.01) |
| *H01M 6/42* | (2006.01) |
| *H01M 10/48* | (2006.01) |
| *H05K 1/14* | (2006.01) |
| *H01M 10/42* | (2006.01) |
| *H05K 1/02* | (2006.01) |

(52) U.S. Cl.
CPC .............. *H05K 1/148* (2013.01); *H01M 2/204* (2013.01); *H01M 10/425* (2013.01); *H05K 1/0263* (2013.01); *H05K 2201/10037* (2013.01); *H05K 2201/10151* (2013.01); *H05K 2201/10356* (2013.01); *H05K 2201/10409* (2013.01)

(58) Field of Classification Search
CPC .. H01M 2/204; H01M 10/425; H05K 1/0263; H05K 1/148; H05K 2201/10037; H05K 2201/10151; H05K 2201/10356; H05K 2201/10409
USPC .......................... 429/7, 61, 90, 158, 159, 160
See application file for complete search history.

(56) References Cited

U.S. PATENT DOCUMENTS

| | | | |
|---|---|---|---|
| 2006/0255764 A1 | 11/2006 | Cho | |
| 2010/0052692 A1* | 3/2010 | Yano et al. | 324/427 |
| 2010/0062329 A1* | 3/2010 | Muis | 429/158 |
| 2010/0124693 A1 | 5/2010 | Kosugi et al. | |
| 2011/0101920 A1* | 5/2011 | Seo et al. | 320/127 |
| 2011/0165451 A1* | 7/2011 | Kim et al. | 429/153 |
| 2012/0276419 A1* | 11/2012 | Park | 429/7 |
| 2013/0200700 A1* | 8/2013 | Ohkura et al. | 307/10.7 |

FOREIGN PATENT DOCUMENTS

| | | |
|---|---|---|
| JP | 2010-003466 A | 1/2010 |
| JP | 2010-123299 A | 6/2010 |
| JP | 2010-205509 A | 9/2010 |
| KR | 2006-0118112 A | 11/2006 |
| WO | WO 2011105095 A1 * | 9/2011 |

\* cited by examiner

*Primary Examiner* — Sean P Cullen
(74) *Attorney, Agent, or Firm* — Christie, Parker & Hale, LLP

(57) ABSTRACT

A battery pack including a plurality of battery cells, each including an electrode terminal; and a circuit board assembly including: a first circuit board electrically connecting the electrode terminals of adjacent battery cells of the plurality of battery cells; a second circuit board electrically connected to the first circuit board; and a connection wire electrically connected between the second circuit board and the first circuit board.

18 Claims, 7 Drawing Sheets

BATTERY PACK INCLUDING CIRCUIT BOARD ASSEMBLY HAVING FIRST CIRCUIT BOARD CONNECTED TO TERMINALS AND SECOND CIRCUIT BOARD CONNECTED TO FIRST CIRCUIT BOARD

CROSS-REFERENCE TO RELATED APPLICATION

This application claims priority to and the benefit of U.S. Provisional Application No. 61/644,073, filed on May 8, 2012 in the United States Patent and Trademark Office, the entire content of which is incorporated herein by reference.

BACKGROUND

1. Field

Aspects of embodiments of the present invention relate to a battery pack.

2. Description of the Related Art

In general, unlike a primary battery that cannot be charged, a secondary battery can be charged and discharged. The secondary battery is used as an energy source of mobile devices, electric vehicles, hybrid vehicles, electric bicycles, uninterruptible power supplies (UPSs), and the like, and, according to a type of an external device using the secondary battery, the secondary battery may be used in the form of a single battery or in the form of a battery module obtained by grouping a plurality of secondary batteries.

A small mobile device such as a mobile phone may operate using an output and capacity of a single battery during a predetermined time period, but in an electric vehicle, a hybrid vehicle, or the like that requires a great amount of power and drive during a long time period, a battery pack is preferred due to an output and capacity issue, and the battery pack may increase an output voltage or an output current according to the number of included battery cells.

It is required for the battery pack to have a connection structure so as to electrically connect the battery cells, and to have a wiring structure so as to transmit measurement signals measured from the battery cells to a battery management system (BMS).

SUMMARY

According to an aspect of embodiments of the present invention, a battery pack includes a connection structure to electrically connect a plurality of battery cells, and a wiring structure to collect measurement signals measured from the plurality of battery cells integrated into one structure to simplify an assembling process.

According to an embodiment of the present invention, a battery pack includes a plurality of battery cells, each including an electrode terminal; and a circuit board assembly including: a first circuit board electrically connecting the electrode terminals of adjacent battery cells of the plurality of battery cells; a second circuit board electrically connected to the first circuit board; and a connection wire electrically connected between the second circuit board and the first circuit board.

The first circuit board may include a conductive bus pattern electrically connecting the electrode terminals of the adjacent battery cells.

In one embodiment, the first circuit board has a pair of openings receiving the electrode terminals of the adjacent battery cells therethrough, and the battery pack further includes a pair of coupling members coupling the first circuit board to the electrode terminals of the adjacent battery cells.

In one embodiment, the first circuit board further includes an insulative base board, and the bus pattern is on a surface of the base board, and an area of the base board is larger than an area of the bus pattern such that there is a gap between the base board and each of the coupling members at outer sides of the electrode terminals.

A voltage of the bus pattern may be output to the second circuit board through the connection wire.

The first circuit board may further include a thermistor on the bus pattern. The thermistor may be between the electrode terminals of the adjacent battery cells and may be nearer to one of the electrode terminals of the adjacent battery cells than to the other of the electrode terminals of the adjacent battery cells.

The first circuit board may further include an insulative base board, and the bus pattern may be on a surface of the base board.

In one embodiment, the bus pattern includes a first bus pattern and a second bus pattern, and the first circuit board further includes an insulative base board, the first and second bus patterns being arranged on opposite surfaces of the base board, and a connection unit electrically connecting the first and second bus patterns.

The first circuit board may further include an insulative base board, and the bus pattern may be housed in the base board.

The second circuit board may receives a voltage measurement signal and a temperature measurement signal of at least one of the adjacent battery cells via the first circuit board and the connection wire to perform a battery management system (BMS) function.

The first circuit board may include a plurality of first circuit boards electrically connecting the electrode terminals of respective pairs of the adjacent battery cells. Adjacent first circuit boards of the plurality of first circuit boards may be spaced apart from each other by a gap.

First circuit boards of the plurality of first circuit boards may be arranged in first and second rows at opposite sides of the second circuit board.

In one embodiment, the first circuit boards have respective conductive bus patterns, and the conductive bus patterns of the first circuit boards in the first row are staggered with respect to the conductive bus patterns of the first circuit boards in the second row along a direction in which the plurality of battery cells is arranged.

The battery pack may further include: a top plate between the plurality of battery cells and the circuit board assembly; a pair of end plates at opposite ends of the plurality of battery cells; and a first side plate and a second side plate arranged at opposite sides of the plurality of battery cells and coupled between the pair of end plates.

In one embodiment, the first circuit board includes a plurality of first circuit boards electrically connecting the electrode terminals of respective pairs of the adjacent battery cells, and the top plate includes: a base frame coupled to the pair of end plates; a first support frame coupled between the base frame and the first side plate, the first support frame arranged between a pair of adjacent first circuit boards of the plurality of first circuit boards; and a second support frame coupled between the base frame and the second side plate, the second support frame arranged between another pair of adjacent first circuit boards of the plurality of first circuit boards.

At least one of the first support frame or the second support frame may include a bent portion facing the respective first or second side plate.

The connection wire may be electrically connected to the first circuit board via a connector.

The connection wire may be flexible.

According to another embodiment of the present invention, a battery pack includes: a plurality of battery cells; a first circuit board that is disposed on each of electrode terminals of the plurality of battery cells so as to be electrically connected to the electrode terminals; a second circuit board that is electrically connected to the first circuit board; and a connection wire that mediates connection between the first and second circuit boards.

The first circuit board may connect a pair of the electrode terminals that are adjacent to each other.

The first circuit board may include a plurality of first circuit boards that connect different pairs of the electrode terminals.

The plurality of first circuit boards may be separated from each other by having a gap formed therebetween.

The first circuit board may output a voltage measurement signal by being electrically connected to each of the electrode terminals, and may output a temperature measurement signal by being thermally connected to each of the electrode terminals.

The voltage measurement signal and the temperature measurement signal may be transmitted to the second circuit board via the connection wire.

The voltage measurement signal may be output from a bus pattern that is conductively connected to each of the electrode terminals.

The temperature measurement signal may be output from a thermistor mounted on a bus pattern that is conductively connected to each of the electrode terminals.

The first circuit board may include a base board that has an insulating property; and a bus pattern that is supported by the base board and is conductively connected to each of the electrode terminals.

The first circuit board may further include coupling holes to which the electrode terminals are inserted, and the bus pattern between a pair of the coupling holes may connect the adjacent electrode terminals.

Coupling members may be coupled on the electrode terminals that are inserted into the coupling holes, and the coupling members may be formed of a conductive material so as to provide a conductive connection between the electrode terminals and the bus pattern.

The battery pack may further include a thermistor disposed on the bus pattern, wherein the thermistor is mounted at a position that leans to one of the pair of the coupling holes.

The bus pattern may be formed on at least one surface of the base board.

The bus pattern may include first and second bus patterns that are respectively formed on different surfaces of the base board, and the first and second bus patterns may be conductively connected to each other via a connection unit.

The bus pattern may be housed in the base board.

The second circuit board may be disposed while crossing an upper center of the plurality of battery cells, and the first circuit board may be disposed in two rows by having the second circuit board formed therebetween.

The connection wire may have flexibility.

According to an aspect of embodiments of the present invention, a connection structure for electrical connection between a plurality of battery cells, and a wiring structure for collection of voltage/temperature measurement signals from each battery cell may be formed in one circuit board assembly, such that the connection structure for electrical connection and the wiring structure for collection of the voltage/temperature measurement signals may be concurrently or simultaneously mounted by mounting the circuit board assembly. In this manner, because a connecting operation and a wiring operation are concurrently or simultaneously performed, workability and productivity may be improved, compared to a case in which a plurality of wires are individually checked and connected.

BRIEF DESCRIPTION OF THE DRAWINGS

The accompanying drawings, together with the specification, illustrate some exemplary embodiments of the present invention, and, together with the description, serve to explain aspects and principles of the present invention.

DESCRIPTION OF REFERENCE NUMERALS INDICATING SOME ELEMENTS IN THE DRAWINGS

| | |
|---|---|
| 10: battery cell | 10a: electrode terminal |
| 10b: case of battery cell | 15: bus bar |
| 50: spacer | 120: top plate |
| 121: base frame | 125: support frame |
| 1251: first support frame | 1252: second support frame |
| 125a: bending part of support frame | 140: side plate |
| 140': heat dissipation hole | 140a: projection part |
| 141: first side plate | 142: second side plate |
| 150: end plate | 151: base plate |
| 152: side flange part | 153: bottom flange part |
| 155: top flange part | 180: circuit board assembly |
| 181, 281, 381: first circuit board | 181a, 281a, 381a: base board |
| 181b, 281b1, 281b2, 381b: bus pattern | 181', 281', 381': coupling hole |
| 182: second circuit board | 183: thermistor |
| 185: connection wire | 190: coupling member |
| 281b1: first bus pattern | 281b2: second bus pattern |
| 281c: connection unit | |
| R1: first row of first circuit board | R2: second row of first circuit board |
| c: connector | g: gap |

DETAILED DESCRIPTION

In the following detailed description, some exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

Figure 1:
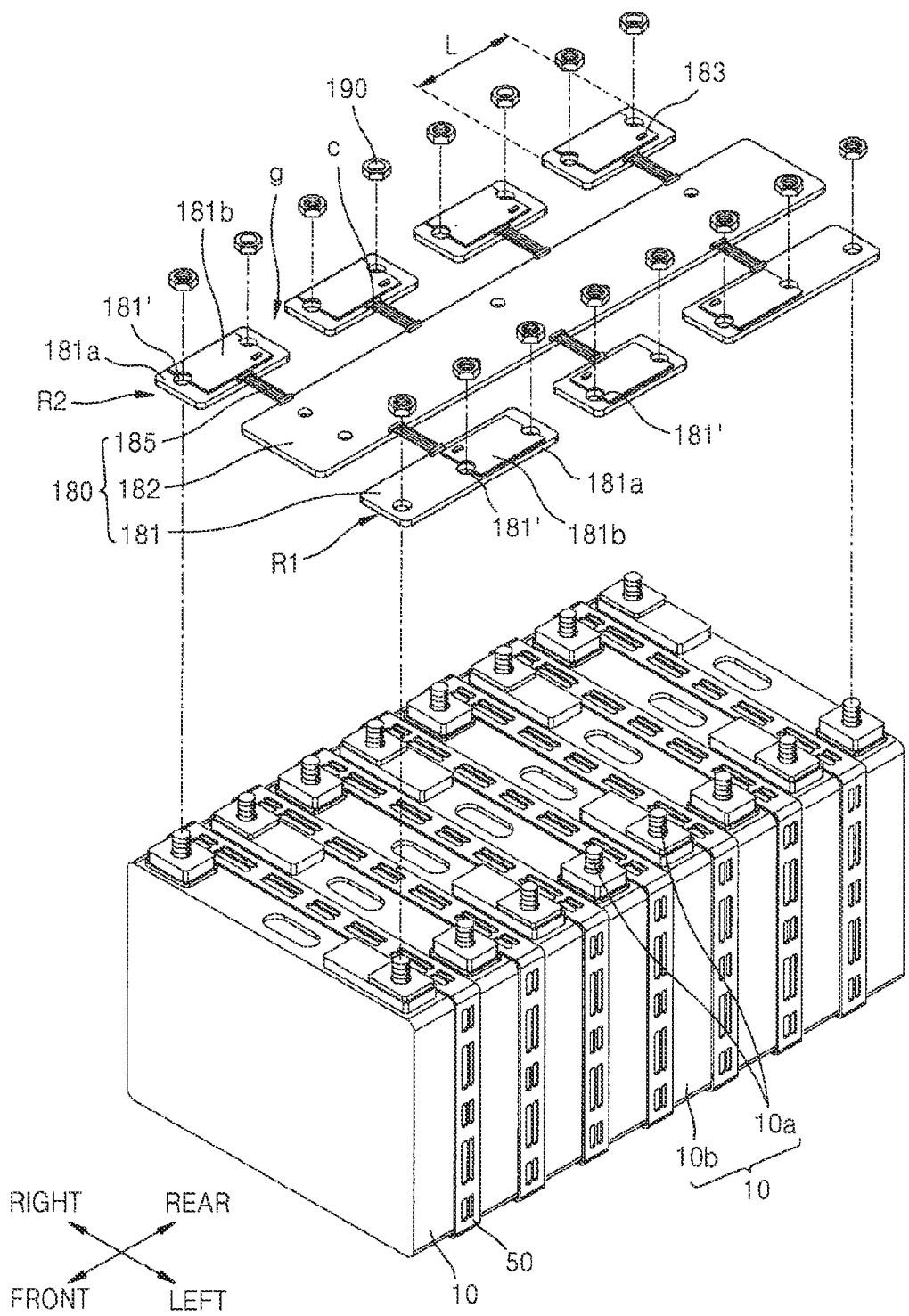
FIG. 1 is an exploded perspective view of a battery pack according to an embodiment of the present invention.
Figure 2:
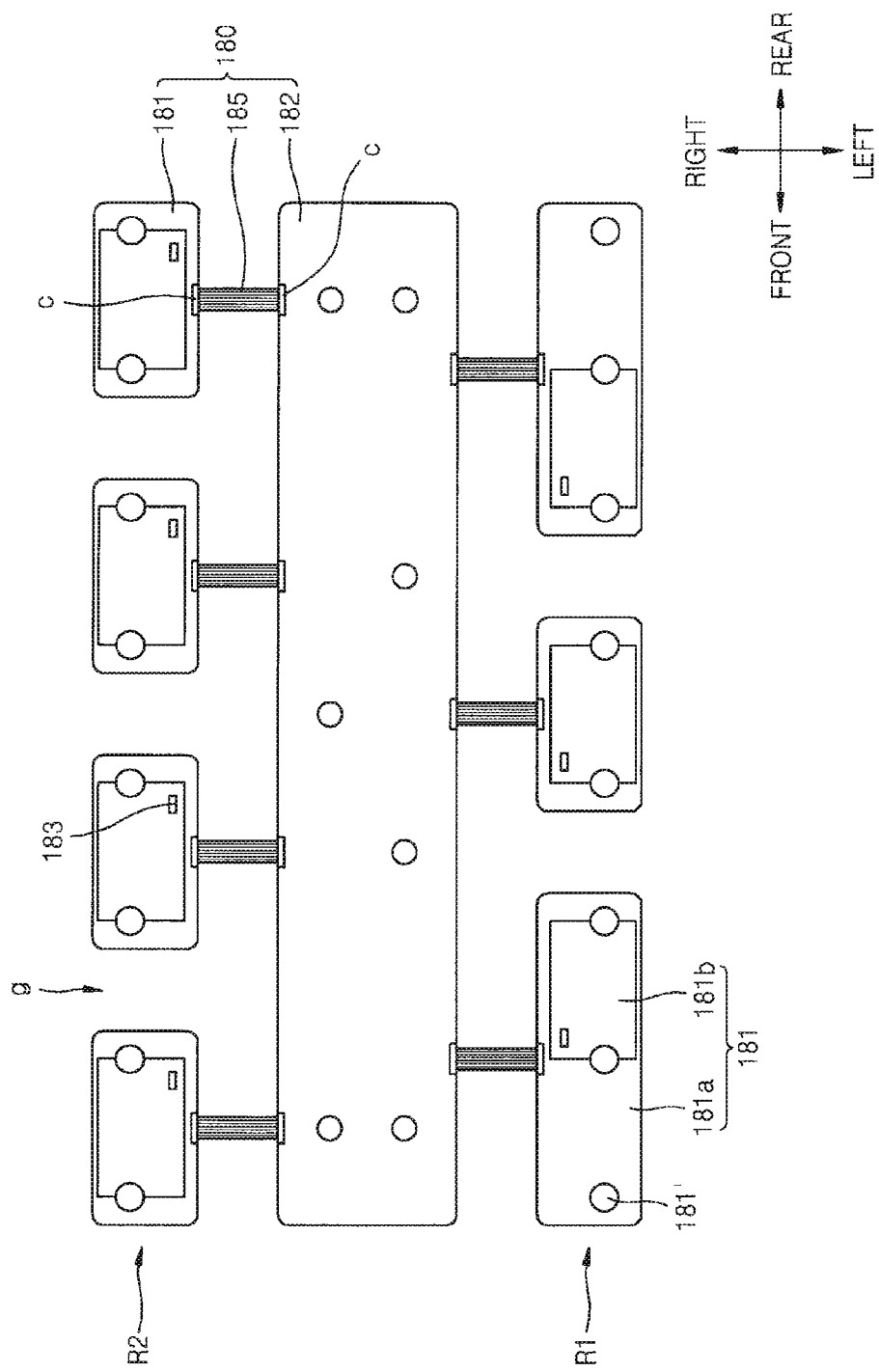
FIG. 2 is a top view of a circuit board assembly of the battery pack of FIG. 1.

FIG. 1 is an exploded perspective view of a battery pack according to an embodiment of the present invention. FIG. 2 is a top view of a circuit board assembly of the battery pack of FIG. 1.

Referring to FIG. 1, the battery pack includes a plurality of battery cells 10 that are arranged or arrayed in a direction (e.g., in front and rear directions), and a circuit board assembly 180 that is disposed on the battery cells 10. The circuit board assembly 180, in one embodiment, includes a first circuit board 181 that is electrically connected to an electrode terminal 10a of the battery cell 10, a second circuit board 182 that is electrically connected to the first circuit board 181, and a connection wire 185 connected between the first and second circuit boards 181 and 182. The first circuit board 181 may be disposed on the electrode terminals 10a of adjacent battery cells 10 so as to connect the battery cells 10 that are adjacent to each other in a direction (e.g., the front and rear directions). For example, the first circuit board 181 may be disposed on the electrode terminals 10a of the adjacent battery cells 10 which are exposed.

A secondary battery such as a lithium-ion battery may be used as the battery cell 10, and, in this regard, various types of secondary batteries including a round-shaped secondary battery, a rectangular-shaped secondary battery, a polymer secondary battery, or the like may be applied thereto and thus a shape of the secondary battery is not limited.

In one embodiment, each of the battery cells 10 may include a case 10b, an electrode assembly (not shown) that is housed in the case 10b, and the electrode terminal 10a that is electrically connected to the electrode assembly (not shown) and is extended externally from the case 10b. For example, the electrode terminal 10a may be arranged at a top portion of the battery cell 10 and protruding from a top surface of the battery cell 10 and may be exposed on the case 10b. Also, the electrode terminals 10a having opposite polarities may be arranged along a direction (e.g., left and right directions) of the battery cell 10.

For example, the battery cells 10 that are adjacent to each other in a direction (e.g., the front and rear directions) may be electrically connected to each other through connection of the electrode terminals 10a, and, in this regard, the electrode terminals 10a that are adjacent to each other may be electrically connected to each other via the circuit board assembly 180.

The circuit board assembly 180 may modularize the battery cells 10 by electrically connecting the battery cells 10 that are arrayed in a direction (e.g., the front and rear directions). For example, the circuit board assembly 180 may connect a pair of the adjacent battery cells 10 in series or in parallel.

The circuit board assembly 180 may include a plurality of the first circuit boards 181 that connect different pairs of the battery cells 10. The first circuit boards 181 may be disposed in a row along a direction (e.g., the front and rear directions) so as to mutually connect the different pairs of the battery cells 10. In one embodiment, the first circuit boards 181 are disposed in two rows, i.e. first and second rows R1 and R2, and having the second circuit board 182 arranged therebetween.

The first and second rows R1 and R2 of the first circuit boards 181 may extend in parallel along a direction (e.g., the front and rear directions). The first circuit boards 181 that respectively form each of the first and second rows R1 and R2 may be separated from each other by having a gap "g" formed therebetween. The first circuit board 181 may have a length "L" that is sufficiently long so as to connect a pair of the adjacent electrode terminals 10a and that is sufficiently short so as to form the gap "g" between the first circuit board 181 and an adjacent one of the first circuit boards 181. Because a position of the electrode terminal 10a may have a deviation within a tolerance range, the gap "g" may be arranged between the first circuit boards 181 so as to allow the first circuit boards 181 to relatively move with respect to the position of the electrode terminal 10a.

The first and second rows R1 and R2 of the first circuit boards 181 may be respectively formed at opposite sides (e.g., left and right sides) of the second circuit board 182 so as to correspond to the opposite (e.g., left and right) electrode terminals 10a of the battery cells 10. In this manner, the battery cells 10 may be serially connected to each other in a zigzag pattern by using the first circuit boards 181 that are disposed in the first and second rows R1 and R2. When the battery cells 10 adjacent to each other in a direction (e.g., the front and rear directions) are disposed such that the electrode terminals 10a having opposite polarities are adjacent to each other, for example, when the battery cells 10 are disposed in such a manner that the battery cells 10 are leftward and rightward inverted in the front and rear directions, the first circuit boards 181 that are disposed in the first and second rows R1 and R2 may serially connect the battery cells 10 in the zigzag pattern.

In one embodiment, the first circuit boards 181 may be alternately disposed in the first and second rows R1 and R2 along a direction of the rows (e.g., the front and rear directions) of the battery cells 10. That is, one of the first circuit boards 181 or a bus pattern 181b of the first circuit board 181 may be disposed in the first row R1 along the direction of the first row R1, then one of the first circuit board 181 or a bus pattern 181b of the first circuit board 181 may be disposed in the second row R2 along the direction of the second row R2, and then another one of the first circuit boards 181 or a bus pattern 181b of the first circuit board 181 may be disposed in the first row R1 along the direction of the first row R1 (e.g., the front and rear directions).

The first circuit board 181 may include the bus pattern 181b that electrically connects a pair of the adjacent electrode terminals 10a. In one embodiment, the bus pattern 181b is formed of a conductive material that is patterned on a base board 181a having an insulating property. In one embodiment, the first circuit board 181 includes the base board 181a having an insulating property, and the bus pattern 181b formed on at least one surface of the base board 181a. Also, coupling holes 181' may be formed in the first circuit board 181 to allow the pair of the adjacent electrode terminals 10a to be inserted therein. The bus pattern 181b may be formed between the coupling holes 181' to electrically connect a pair of the electrode terminals 10a that are inserted into the coupling holes 181'.

A pair of the coupling holes 181' to which the adjacent electrode terminals 10a are inserted may be formed in the first circuit board 181, and coupling members 190, such as nuts, may be coupled with upper portions of the electrode terminals 10a which are inserted through the coupling holes 181', such that the first circuit board 181 may be fixed at the electrode terminals 10a. In one embodiment, for example, the upper portion of the electrode terminal 10a may have a spiral or threaded shape for screw coupling, and the coupling member 190 may be coupled therewith via the spiral or threaded shape. The coupling member 190, in one embodiment, is formed of a conductive material so as to provide a conductive connection between the electrode terminal 10a and the bus pattern 181b.

In one embodiment, one or more of the first circuit boards 181 may have three coupling holes 181'. For example, one of the coupling holes 181' may receive an electrode terminal 10a that forms an input/output (I/O) terminal, without connection to the adjacent electrode terminal 10a, in addition to a pair of the coupling holes 181' for the electrode terminals 10a that are adjacent to each other in a direction (e.g., the front and rear directions).

Figure 3:
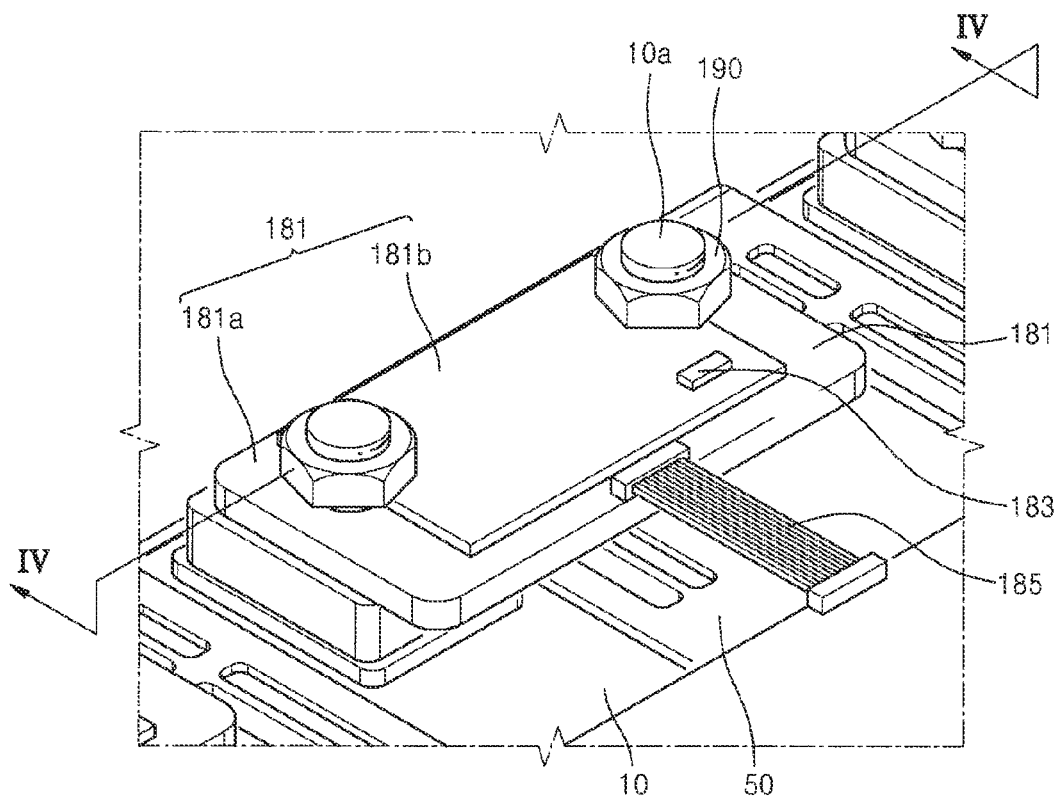
FIG. 3 is a partial perspective view showing a connection between a first circuit board and an electrode terminal of the battery pack of FIG. 1.
Figure 4:
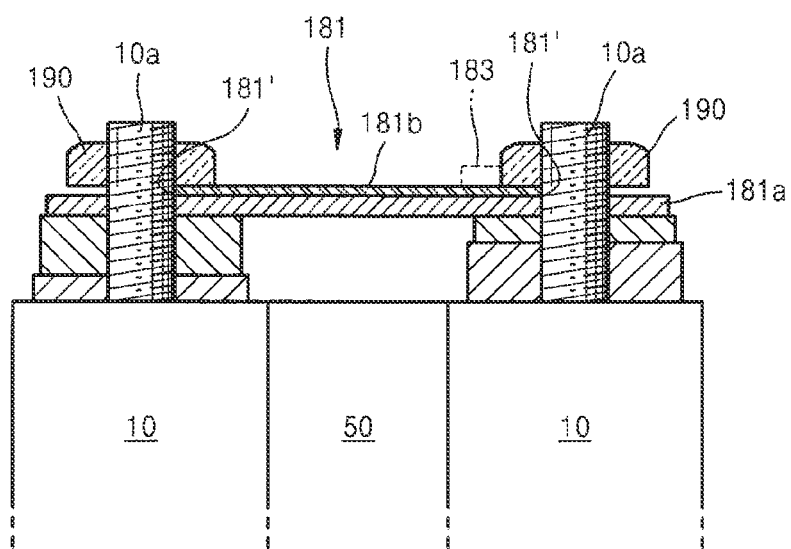
FIG. 4 is a cross-sectional view of the connection shown in FIG. 3, taken along the line IV-IV.

FIG. 3 a partial perspective view showing a connection between the first circuit board 181 and the electrode terminal 10a of the battery pack of FIG. 1. FIG. 4 is a cross-sectional view of the connection shown in FIG. 3, taken along the line IV-IV. Referring to FIGS. 3 and 4, the first circuit board 181 may be conductively connected to the electrode terminals 10a and thus may generate status information of each of the battery cells 10. Throughout the specification, a "conductive connection" may refer to an electrical connection and/or a thermal connection. The status information of each of the battery cells 10 may be used to check for an incorrect operation, such as overheating of the battery cell 10 or overcharging of the battery cell 10, or to detect a charge or discharge level such as a full charge, and may include a temperature measurement signal or a voltage measurement signal with respect to the battery cell 10.

The first circuit board 181 may output the voltage measurement signal by being electrically connected to the electrode terminal 10a, and may output the temperature measurement signal by being thermally connected to the electrode terminal 10a. That is, the first circuit board 181 may be electrically connected to the electrode terminal 10a, and, in one embodiment, the electrode terminal 10a, and the bus pattern 181b of the first circuit board 181 may form equipotential via the coupling member 190 that fixes the first circuit board 181. A voltage of the battery cell 10 may be measured by measuring a voltage of the first circuit board 181 (i.e. the bus pattern 181b), such that the voltage measurement signal may be output from the bus pattern 181b.

The first circuit board 181 may be thermally connected to the electrode terminal 10a. In one embodiment, an operation heat of the electrode terminal 10a may be transferred to the bus pattern 181b of the first circuit board 181 via the coupling member 190 that fixes the first circuit board 181. In one embodiment, a thermistor 183 for temperature measurement may be disposed on the bus pattern 181b of the first circuit board 181, and the temperature measurement signal may be output from the thermistor 183. The thermistor 183 may be formed as a variable resistor whose resistance varies according to temperature, and the temperature may be calculated by measuring voltages that are applied to both end terminals of the thermistor 183.

The thermistor 183 may be mounted on the bus pattern 181b of the first circuit board 181. In one embodiment, the coupling holes 181' to which the electrode terminals 10a are inserted are formed in the first circuit board 181, and temperature of the electrode terminals 10a is measured via thermal transfer from the electrode terminals 10a that are inserted into the coupling holes 181'. In this regard, the thermistor 183 may be mounted between a pair of the coupling holes 181', and, in one embodiment, the thermistor 183 may be mounted at a position that is nearer to or biased toward one of the coupling holes 181' than to the other. This is because heat generation of the battery cell 10 may be relatively biased to a negative electrode, compared to a positive electrode. That is, by disposing the thermistor 183 at a position nearer to the electrode terminal 10a of the negative electrode at which heat generation may be relatively concentrated, overheating of the battery cell 10 may be accurately detected.

Referring to FIGS. 1 and 2, the temperature measurement signal and the voltage measurement signal of the first circuit board 181 may be transmitted to the second circuit board 182 via the connection wire 185. The second circuit board 182 may extend in a direction (e.g., the front and rear directions), may cross upper portions of the battery cells 10, and may be disposed approximately at center regions of the battery cells 10. The second circuit board 182 may be relatively longer than the first circuit board 181 and may be electrically connected to the first circuit boards 181 that are disposed at the opposite sides (e.g., left and right sides) of the second circuit board 182 while the second circuit board 182 extends in parallel with the first and second rows R1 and R2 of the first circuit boards 181.

The second circuit board 182 may collect a plurality of pieces of status information of the battery cells 10 which are received from the first circuit boards 181 that are disposed in a distributed manner on the electrode terminals 10a of the battery cells 10, and according to the plurality of pieces of collected status information, the second circuit board 182 may check for an incorrect operation, such as overheating of each battery cell 10 or overcharge of each battery cell 10 or may detect a charge or discharge level such as a full charge. Also, the second circuit board 182 may perform a battery management system (BMS) function so as to control charging and discharging operations of the battery cells 10 by using the plurality of pieces of collected status information. Although not illustrated, a plurality of electric devices may be mounted on the second circuit board 182 so as to perform the BMS function.

For example, the second circuit board 182 may convert an analog measurement signal such as the voltage measurement signal or the temperature measurement signal which is transmitted from the first circuit board 181 via the connection wire 185 into a digital signal, and the digital signal may be used as data to control the charging and discharging operations of the battery cells 10.

The first and second circuit boards 181 and 182 are electrically connected to each other via the connection wire 185. The connection wire 185 may form a signal transmission line so as to transmit the temperature measurement signal and/or the voltage measurement signal, which is output from the first circuit board 181, to the second circuit board 182. In one embodiment, for example, the connection wire 185 may be in the form of a flexible printed circuit board (FPCB) in which a plurality of conductive wires (not shown) are patterned, and the plurality of conductive wires may be patterned on an insulating substrate (not shown) so as to transmit different signals. In another embodiment, the connection wire 185 may be formed as a cable, and, in this regard, the connection wire 185 may include a plurality of cables (not shown) so as to transmit different signals.

The connection wire 185 may be configured having any of various forms without limitation provided that the connection wire 185 may electrically connect the first and second circuit boards 181 and 182. In one embodiment, for example, the first and second circuit boards 181 and 182, and the connection wire 185 may be electrically connected to each other via a connector "c." However, embodiments of the present invention are not limited thereto. In one embodiment, for example, the first and second circuit boards 181 and 182, and the connection wire 185 may be connected to each other by using a detachable connector "c," or may be integrally connected.

The connection wire 185, in one embodiment, may be flexible such that the connection wire 185 may be flexibly bent to allow relative positional movement between the first and second circuit boards 181 and 182. Thus, in the circuit board assembly 180, the first and second circuit boards 181 and 182 may be electrically connected to each other via the connection wire 185, while relative positional movement between the first and second circuit boards 181 and 182 is allowed by the connection wire 185 having flexibility. That is, the first circuit boards 181 that are disposed at a plurality of positions corresponding to the electrode terminals 10*a*, and the second circuit board 182 that forms electrical connection with the first circuit boards 181 and collects measurement signals may not be formed as one board, but, rather, may be formed as separate boards and connected to each other via the connection wires 185 having flexibility, such that the relative positional movement is allowed therebetween. Further, due to the connection wire 185 having flexibility, vibration and/or shock of the battery pack may be absorbed or reduced, and vibration-resistant and shock-resistant performances of the battery pack may be improved.

In one embodiment, positions of the electrode terminals 10*a* that are arrayed in a direction (e.g., the front and rear directions) may have deviation within a tolerance range, and positions of the first circuit boards 181 may vary to some extent, corresponding to the positions of the electrode terminals 10*a* via deformation of the connection wire 185 having flexibility.

According to an embodiment of the present invention, the circuit board assembly 180 is disposed on the battery cells 10, and the first circuit boards 181 are coupled with the electrode terminals 10*a*, such that coupling and wiring operations of the battery cells 10 are concurrently or simultaneously completed. Thus, for example, the battery cells 10 that are arranged or arrayed in a direction (e.g., the front and rear directions) may be serially connected, and concurrently or simultaneously, a wiring operation to measure and collect a plurality of pieces of status information regarding temperatures and voltages of the battery cells 10 may be completed.

Referring to FIG. 1, in one embodiment, a spacer 50 may be interposed between the adjacent battery cells 10. The spacer 50 may electrically insulate the adjacent battery cells 10. For example, the case 10*b* may have an electrical polarity, and, in this regard, an electrical interference between the adjacent battery cells 10 may be blocked by interposing the spacer 50 that is formed of an insulating material therebetween.

In one embodiment, the spacer 50 may be interposed between the adjacent battery cells 10, thereby suppressing thermal expansion of the battery cells 10, i.e. swelling of the battery cells 10. The case 10*b* of the battery cell 10 may be formed of a metal material that may be deformed, and, in one embodiment, the spacer 50 is formed of a material, such as a polymer material, having a small deformation characteristic, and the swelling of the battery cells 10 may be suppressed.

Figure 5:
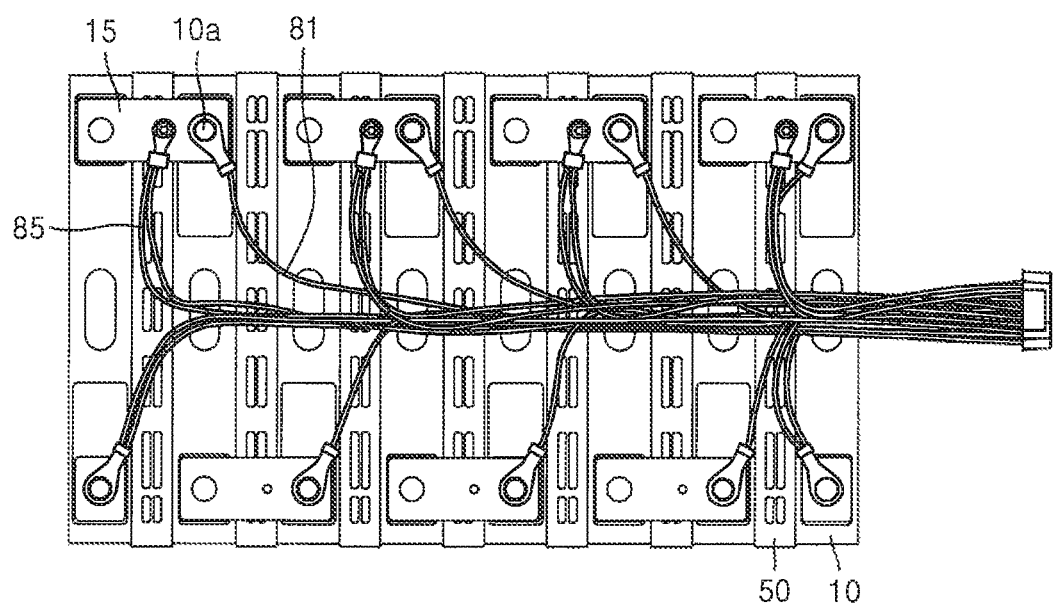
FIG. 5 is a top view of a battery pack according to a comparative example.

FIG. 5 is a top view of a battery pack according to a comparative example. In an assembling procedure of the battery pack according to the comparative example, bus bars 15 are mounted to electrically connect adjacent electrode terminals 10*a*, and then a wiring operation is performed to collect various status information from the plurality of battery cells 10. That is, voltage measurement wiring 81 is formed between the electrode terminals 10*a* of the battery cells 10 and a BMS (not shown) so as to transfer voltage measurement signals, and temperature measurement wiring 85 is formed between the bus bars 15 and the BMS (not shown) so as to transfer temperature measurement signals. Here, each of a plurality of the wiring 81 and 85 is checked, and then ring terminals (not shown) that are formed at ends of the plurality of the wiring 81 and 85 are coupled with the electrode terminals 10*a* or the bus bars 15. However, the wiring operation in which the wirings 81 and 85 are individually assembled requires a large number of processes and a large amount of operation time, such that workability and productivity is decreased.

As illustrated in FIGS. 1 and 2, according to embodiments of the present invention, the bus pattern 181*b* for electrical connection between the battery cells 10, and the connection wire 185 for transmission of a measurement signal are formed in the one circuit board assembly 180, such that when the circuit board assembly 180 is mounted, the bus pattern 181*b* and the connection wire 185 may be concurrently or simultaneously mounted. For example, when the circuit board assembly 180 is disposed on the battery cells 10 that are arrayed in a direction (e.g., the front and rear directions), the first circuit boards 181 are disposed on the electrode terminals 10*a*, respectively, and the second circuit board 182 is disposed in a direction crossing the central regions of the battery cells 10. The circuit board assembly 180 is fixed by coupling the first circuit boards 181 with the electrode terminals 10*a*, such that a coupling operation of electrically connecting the adjacent battery cells 10, and a wiring operation of transmitting various status information of the plurality of battery cells 10 may be concurrently or simultaneously completed.

Figure 6:
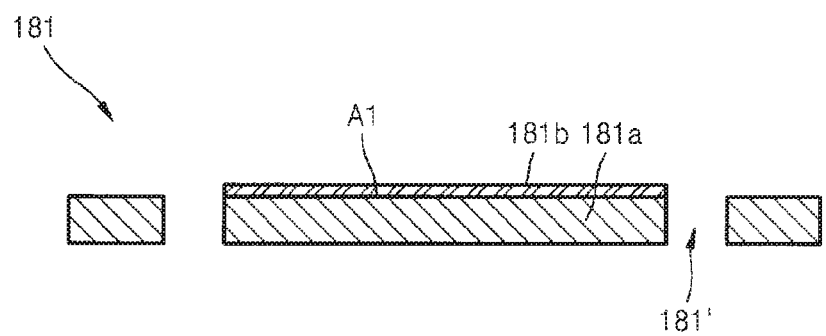
FIGS. 6 through 8 are schematic cross-sectional views of first circuit boards of a battery pack according to various embodiments of the present invention.
Figure 7:
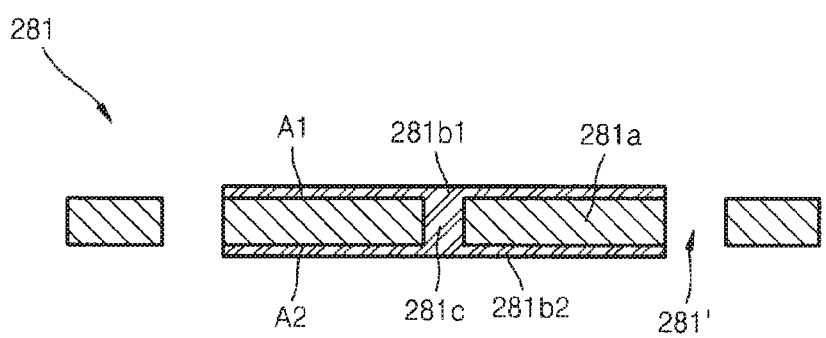
Figure 8:
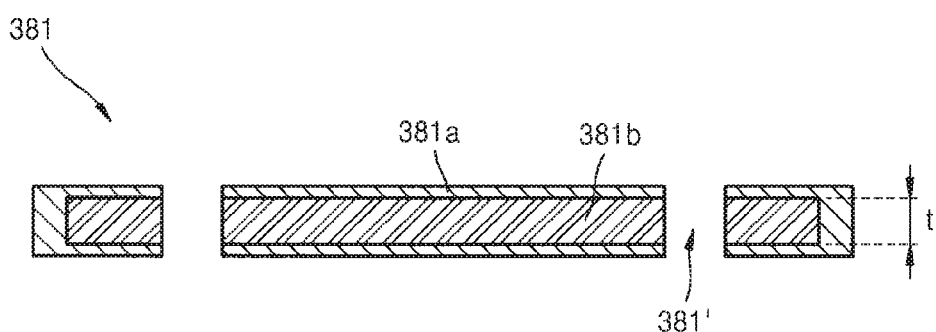

FIGS. 6 through 8 are schematic cross-sectional views of first circuit boards of a battery pack according to various embodiments of the present invention.

Referring to FIG. 6, the first circuit board 181, in one embodiment, includes the base board 181*a* having an insulating property, and the bus pattern 181*b* formed on a first surface A1 of the base board 181*a*. The bus pattern 181*b* is formed of a conductive material to electrically connect a pair of the electrode terminals 10*a* that are inserted into the coupling holes 181'.

Referring to FIG. 7, a first circuit board 281 according to another embodiment of the present invention includes a base board 281*a* having an insulating property, first and second bus patterns 281*b*1 and 281*b*2 respectively formed on first and second surfaces A1 and A2 that are opposite to each other, and a connection unit 281*c* conductively connecting the first and second bus patterns 281*b*1 and 281*b*2.

The first and second bus patterns 281*b*1 and 281*b*2 are formed of a conductive material to electrically connect a pair of the electrode terminals 10*a* that are inserted into coupling holes 281' of the first circuit board 281. Because the first and second bus patterns 281*b*1 and 281*b*2 are electrically connected to each other via the connection unit 281*c*, resistance of an electrical path that connects the pair of the electrode terminals 10*a* may be reduced. In one embodiment, the connection unit 281*c* may be formed by filling a conductive material in a via-hole that penetrates through the base board 281*a*, but embodiments of the present invention are not limited thereto.

Referring to FIG. 8, a first circuit board 381 according to another embodiment of the present invention includes a base board 381*a* having an insulating property, and a bus pattern 381*b* housed in the base board 381*a*. The bus pattern 381*b* is formed of a conductive material to electrically connect a pair of the electrode terminals 10*a* that are inserted into coupling holes 381' of the first circuit board 381. The bus pattern 381*b* may have a thickness "t" that is sufficient to provide a low-resistance path that connects the pair of the electrode terminals 10*a*. In this manner, by forming the bus pattern 381*b* in the base board 381*a*, it is easier to increase the thickness "t" of the bus pattern 381*b*, compared to a case in which the bus pattern is formed on a surface of the base board. That is, by using the bus pattern 381*b* housed in the base board 381*a* and having a block shape, for example, instead of forming a bus pattern on the surface of a base board, the thickness "t" of the bus pattern 381*b* may be easily increased.

Figure 9:
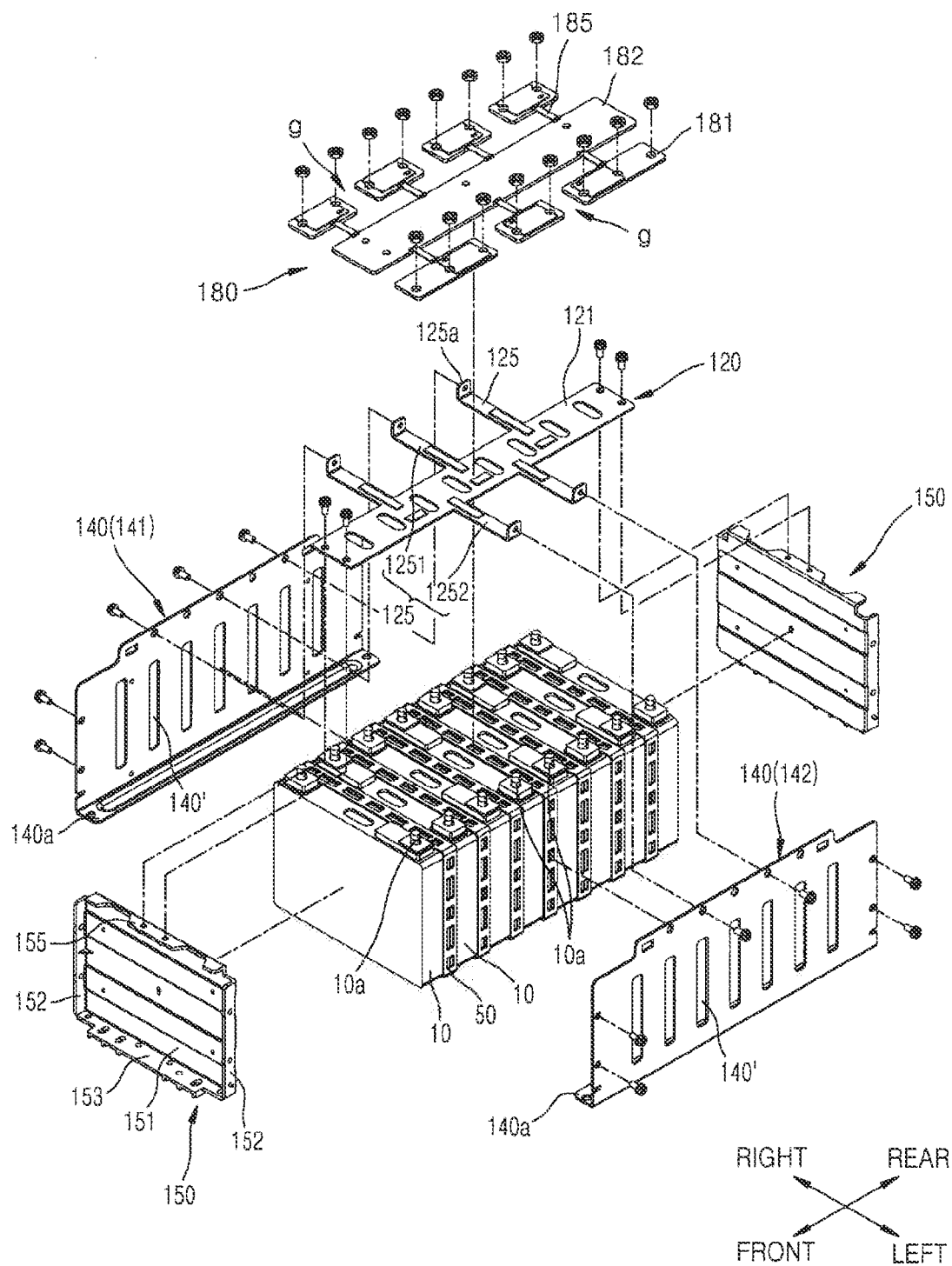
FIG. 9 is an exploded perspective view of a battery pack according to another embodiment of the present invention.

FIG. 9 is an exploded perspective view of a battery pack according to another embodiment of the present invention. Referring to FIG. 9, the battery pack may include a plurality of the battery cells 10 that are arranged along a direction (e.g., front and rear directions), the circuit board assembly 180 that is electrically connected to the battery cells 10, and top, side, and end plates 120, 140, and 150 that are disposed to surround the battery cells 10.

The top, side, and end plates 120, 140, and 150 may structurally couple an array of the battery cells 10, and may group the array of the battery cells 10 by one module and connect the battery cells 10. In one embodiment, the top, side, and end plates 120, 140, and 150 may suppress volume expansion of the battery cells 10 due to charging and discharging operations and may maintain a resistance characteristic, such that the top, side, and end plates 120, 140, and 150 may prevent or substantially prevent deterioration of an electrical characteristic of the battery cells 10. In one embodiment, for example, the end plate 150 may include a pair of end plates 150 disposed at both ends of the battery cells 10 in an array direction (e.g., front and rear directions) of the battery cells 10, and the side plate 140 may include a pair of first and second side plates 141 and 142 disposed at both sides (e.g., in left and right directions) of the battery cells 10. The top plate 120, in one embodiment, is disposed on the battery cells 10.

In one embodiment, the end plates 150 may be disposed at both ends of the battery cells 10 in the array direction (e.g., the front and rear directions) of the battery cells 10. The end plate 150 may be disposed in such a manner that one surface of the end plate 150 faces an exterior surface of the outer battery cell 10. The end plate 150, in one embodiment, may include a base plate 151, and flange parts 152, 153, and 155 that are bent from ends of the base plate 151 in an opposite direction with respect to the battery cell 10. The base plate 151 may have an area that covers the exterior surface of the outer battery cell 10.

The flange parts 152, 153, and 155 are bent from the end of the base plate 151 in the opposite direction with respect to the battery cell 10. The flange parts 152, 153, and 155 may include a pair of side flange parts 152 that are formed at both side surfaces of the base plate 151, and top and bottom flange parts 155 and 153 that are formed at a top surface and a bottom surface of the base plate 151, respectively.

The flange parts 152, 153, and 155 may provide coupling positions for coupling between the end plate 150 and configuring elements that are adjacent to the end plate 150. In one embodiment, for example, the flange parts 152, 153, and 155 may provide a connection between the side plate 140 and the top plate 120 that are assembled to contact each other along edges of the end plate 150. In one embodiment, the flange parts 152, 153, and 155 may increase a mechanical strength of the end plate 150.

The side flange parts 152 may provide coupling positions so as to provide a connection between the end plate 150 and the side plates 140, and, in one embodiment, an end of the side plate 140 which overlaps on the side flange part 152 may be coupled with the side flange part 152 via screw coupling. In one embodiment, a plurality of coupling holes may be formed in the side flange part 152.

The side plates 140, in one embodiment, are disposed at both sides of the battery cells 10. The side plates 140 are disposed to cover side surfaces of the battery cells 10 that are arrayed along a direction (e.g., the front and rear direction). The side plates 140, in one embodiment, include the first and second side plates 141 and 142 that are disposed in a pair at opposite sides of the battery cells 10. The side plates 140 may extend in the array direction of the battery cells 10, and opposite ends of the side plates 140 may be respectively coupled with the end plates 150 that are disposed at opposite ends of the arrayed battery cells 10.

The side plate 140, in one embodiment, may have a plate shape and may include a projection part 140*a* that is bent to support a portion of bottom surfaces of the battery cells 10. The first and second side plates 141 and 142 that are disposed at the opposite sides of the battery cells 10 may support bottoms of the battery cells 10 via a pair of the projection parts 140*a* that are bent toward each other.

The projection parts 140*a* may extend while corresponding to a length (e.g., an entire length) of the side plate 140 along the array direction (e.g., the front and rear directions) of the battery cells 10, and, in one embodiment, opposite ends of the projection part 140*a* may be screw-coupled with the bottom flange parts 153 of the respective end plates 150. In one embodiment, a plurality of heat dissipation holes 140' may be formed in the side plates 140. The heat dissipation holes 140', in one embodiment, may be formed at regular intervals along the array direction (e.g., the front and rear directions) of the battery cells 10. The heat dissipation holes 140' may provide an open path between the battery cells 10 and open air outside the battery pack and thus may rapidly dissipate an operation heat generated by the battery cells 10.

The bottoms of the battery cells 10 may be exposed from the side plate 140, except for portions of the bottoms which are supported by the projection part 140*a*, and in this regard, a flow of the open air outside the battery pack may pass between the battery cells 10 via the bottoms of the battery cells 10 which are exposed from the side plate 140, and heat dissipation from the battery cells 10 may be facilitated.

The top plate 120, in one embodiment, is disposed on the battery cells 10 between the battery cells 10 and the circuit board assembly 180. In one embodiment, the top plate 120 includes a base frame 121 that extends and crosses an upper central region of the battery cells 10 in the array direction (e.g., the front and rear directions) of the battery cells 10, and a support frame 125 that extends from the base frame 121 toward the side plates 140.

The base frame 121 may be coupled at opposite ends with the end plates 150 that are arranged at opposite ends of the battery cells 10. The base frame 121, in one embodiment, may be screw-coupled with the top flange parts 155 formed at upper edges of the end plates 150.

The base frame 121 may allow the end plates 150, which are disposed at the opposite ends of the battery cells 10 in the array direction (e.g., the front and rear directions) of the battery cells 10, to support each other and may maintain a constant distance between the end plates 150, such that the base frame 121 may suppress expansion of the battery cells 10 in the array direction (e.g., the front and rear directions) and may prevent or substantially prevent deterioration of charging and discharging characteristics due to deformation of the battery cells 10.

The support frame 125 is coupled with the side plates 140 while the support frame 125 crosses the upper regions of the battery cells 10 in a direction crossing the base frame 121 (e.g., in left and right directions). In one embodiment, the support frame 125 and the base frame 121 may be formed as one body.

In one embodiment, the support frame 125 includes an end that extends from the base frame 121, and another end that is coupled with the side plate 140. In one embodiment, for example, the end of the support frame 125 may integrally extend from the base frame 121, and the other end of the support frame 125 may be screw-coupled with the side plate 140. The other end of the support frame 125 may be bent to face the side plate 140 and may include a bending part 125a that overlaps on the side plate 140.

The support frame 125 may allow the side plates 140 disposed at the opposite sides of the battery cells 10 to support each other and may maintain a constant distance between the side plates 140, such that the support frame 125 may suppress expansion of the battery cells 10 in a direction (e.g., the left and right directions) and may prevent or substantially prevent deterioration of charging and discharging characteristics due to deformation of the battery cells 10.

In one embodiment, the top plate 120 and the circuit board assembly 180 may be disposed together on the battery cells 10. The top plate 120 may be interposed between the circuit board assembly 180 and the battery cells 10. However, the first circuit boards 181 of the circuit board assembly 180 may be electrically connected to the battery cells 10 without having the top plate 120 interposed therebetween, and may be directly coupled with the electrode terminals 10a of the battery cells 10. In this regard, the first circuit boards 181 and the top plate 120 may be formed at positions that do not cause interferences so as to avoid mechanical/electrical interferences with respect to each other.

Figure 10:
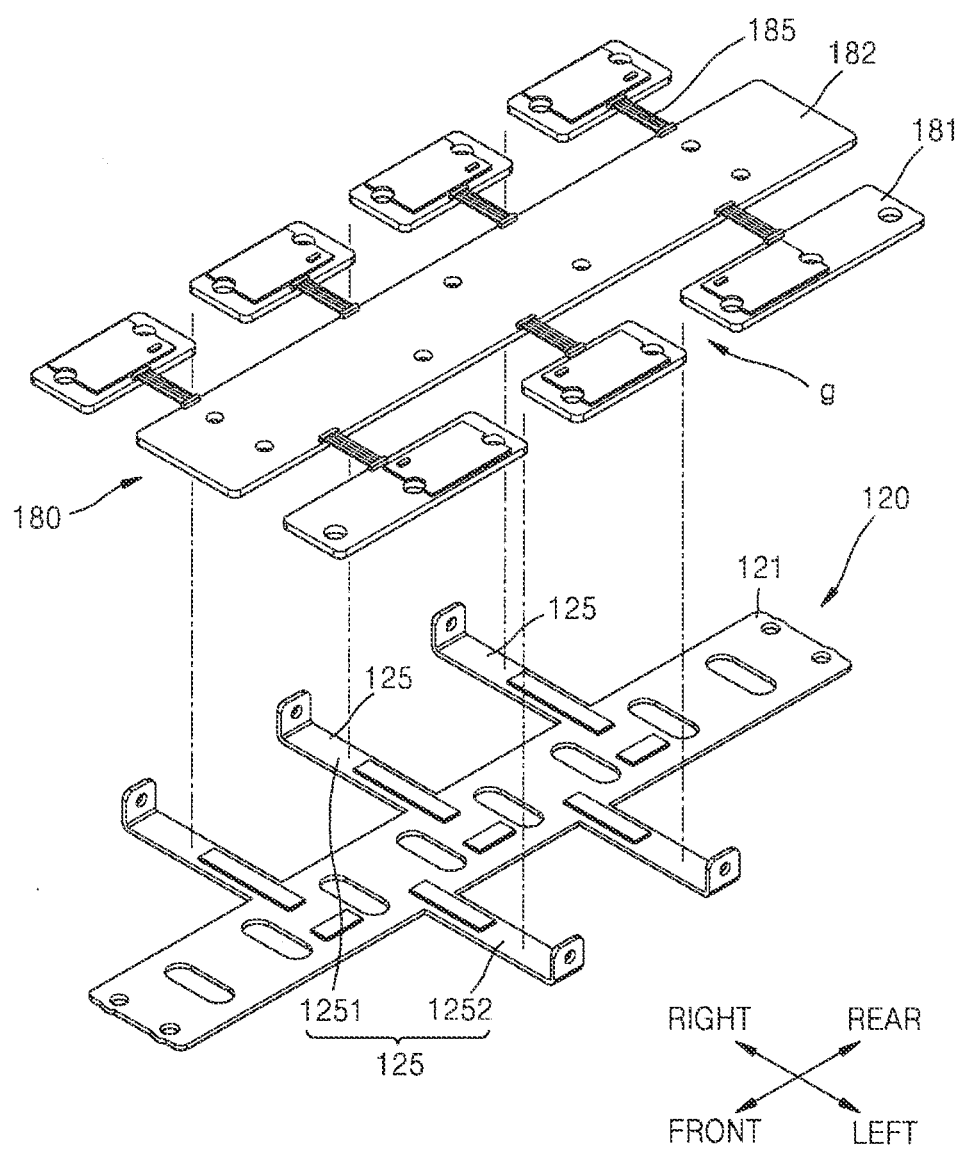
FIG. 10 is an exploded perspective view showing a disposition relation between first circuit boards and a top plate of the battery pack of FIG. 9.

FIG. 10 is an exploded perspective view showing a disposition relation between the first circuit boards 181 and the top plate 120 of the battery pack of FIG. 9.

The battery cells 10 that are adjacent to each other (e.g., along front and rear directions of the battery pack) may be electrically connected (e.g., serially connected) to each other via the first circuit board 181. A plurality of the first circuit boards 181 may be arranged to respectively connect different pairs of the battery cells 10, and the gap "g" may be between the first circuit boards 181.

The top plate 120, in one embodiment, may include one or more first support frames 1251 that extend from one side of the base frame 121 toward the first side plate 141, and one or more second support frames 1252 that extend from the other side of the base frame 121 toward the second side plate 142. The first and second support frames 1251 and 1252 may respectively extend toward the first and second side plates 141 and 142 through the gap "g" between the first circuit boards 181. For example, the first and second support frames 1251 and 1252 may extend through the gaps "g" between the first circuit boards 181 and may extend at positions that alternate with each other along a direction (e.g., front and rear directions) of the battery pack.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof. Descriptions of features or aspects within each embodiment should typically be considered as available for other similar features or aspects in other embodiments.

What is claimed is:

1. A battery pack comprising:
a plurality of battery cells that are arranged along a direction between opposite ends of the plurality of battery cells, each of the battery cells comprising an electrode terminal protruding from a surface of the respective battery cell; and
a circuit board assembly comprising:
a plurality of first circuit boards, each comprising an insulative base board and a conductive bus pattern electrically connecting the electrode terminals of a respective pair of adjacent battery cells of the plurality of battery cells, and each of the plurality of first circuit boards facing the surfaces of the battery cells from which the electrode terminals protrude;
a second circuit board electrically connected to the plurality of first circuit boards, the second circuit board facing the surfaces of the battery cells from which the electrode terminals protrude and extending in the direction along which the battery cells are arranged; and
a connection wire electrically connected between the second circuit board and a first circuit board of the plurality of first circuit boards,
wherein first circuit boards of the plurality of first circuit boards are arranged at opposite sides of the second circuit board.

2. The battery pack of claim 1, wherein the bus pattern is on a surface of the base board.

3. The battery pack of claim 1,
wherein the bus pattern comprises a first bus pattern and a second bus pattern arranged on opposite surfaces of the base board, and
wherein the first circuit board of the plurality of first circuit boards further comprises a connection unit electrically connecting the first and second bus patterns.

4. The battery pack of claim 1, wherein the bus pattern is housed in the base board.

5. The battery pack of claim 1, wherein the second circuit board is configured to receive a voltage measurement signal and a temperature measurement signal of at least one of the respective pair of adjacent battery cells via the first circuit board of the plurality of first circuit boards and the connection wire to perform a battery management system (BMS) function.

6. The battery pack of claim 1, wherein adjacent first circuit boards of the plurality of first circuit boards are spaced apart from each other by a gap.

7. The battery pack of claim 1, wherein the connection wire is electrically connected to the first circuit board of the plurality of first circuit boards via a connector.

8. The battery pack of claim 1, wherein the connection wire is flexible.

9. The battery pack of claim 1, wherein the first circuit board of the plurality of first circuit boards further comprises a thermistor on the bus pattern.

10. The battery pack of claim 9, wherein the thermistor is between the electrode terminals of the respective pair of adjacent battery cells and is nearer to one of the electrode terminals of the respective pair of adjacent battery cells than to another one of the electrode terminals of the respective pair of adjacent battery cells.

11. The battery pack of claim 1, wherein the first circuit boards of the plurality of first circuit boards are arranged in first and second rows at the opposite sides of the second circuit board.

12. The battery pack of claim 11,
wherein the conductive bus patterns of the first circuit boards in the first row are staggered with respect to the conductive bus patterns of the first circuit boards in the second row along the direction in which the plurality of battery cells is arranged.

13. The battery pack of claim 1, further comprising:
a top plate between the plurality of battery cells and the circuit board assembly;
a pair of end plates at the opposite ends of the plurality of battery cells; and a first side plate and a second side plate arranged at opposite sides of the plurality of battery cells, each of the first side plate and the second side plate being coupled to the pair of end plates.

14. The battery pack of claim 13,
wherein the top plate comprises:
   a base frame coupled to the pair of end plates;
   a first support frame coupled between the base frame and the first side plate, the first support frame arranged between a pair of adjacent first circuit boards of the plurality of first circuit boards; and
   a second support frame coupled between the base frame and the second side plate, the second support frame arranged between another pair of adjacent first circuit boards of the plurality of first circuit boards.

15. The battery pack of claim 14, wherein at least one of the first support frame or the second support frame comprises a bent portion facing the respective first or second side plate.

16. A battery pack comprising:
   a plurality of battery cells, each comprising an electrode terminal; and
   a circuit board assembly comprising:
      a plurality of first circuit boards, each comprising an insulative base board, and a conductive bus pattern electrically connecting the electrode terminals of a respective pair of adjacent battery cells of the plurality of battery cells;
      a second circuit board electrically connected to the plurality of first circuit boards; and
      a connection wire electrically connected between the second circuit board and a first circuit board of the plurality of first circuit boards,
   wherein first circuit boards of the plurality of first circuit boards are arranged at opposite sides of the second circuit board,
   wherein the first circuit board of the plurality of first circuit boards has a pair of openings receiving the electrode terminals of the respective pair of adjacent battery cells therethrough, and
   wherein the battery pack further comprises a pair of coupling members coupling the first circuit board to the electrode terminals of the respective pair of adjacent battery cells.

17. The battery pack of claim 16,
wherein the bus pattern is on a surface of the base board, and
wherein an area of the base board is larger than an area of the bus pattern such that there is a gap between the base board and each of the coupling members at outer sides of the electrode terminals.

18. The battery pack of claim 16, wherein a voltage of the bus pattern is output to the second circuit board through the connection wire.

* * * * *